US006578104B1

(12) United States Patent
Small et al.

(10) Patent No.: US 6,578,104 B1
(45) Date of Patent: Jun. 10, 2003

(54) RAM WITH CONFIGURABLE DEPTH AND WIDTH

(75) Inventors: Brian D. Small, Portland, OR (US); Andrew K. Chan, Palo Alto, CA (US)

(73) Assignee: Quick Logic Corporation, Sunnyvale, CA (US)

(*) Notice: Subject to any disclaimer, the term of this patent is extended or adjusted under 35 U.S.C. 154(b) by 0 days.

(21) Appl. No.: 09/345,663

(22) Filed: Jun. 30, 1999

(51) Int. Cl.[7] .......................... G11C 13/00; G06F 12/00
(52) U.S. Cl. .................. 711/104; 711/100; 365/230.03
(58) Field of Search .............................. 711/100, 102, 711/104, 105, 154; 365/154, 189.02, 203, 230.03; 326/40, 41

(56) References Cited

U.S. PATENT DOCUMENTS

| 5,550,782 | A | | 8/1996 | Cliff et al. ............... 365/230.03 |
|---|---|---|---|---|
| 5,687,325 | A | | 11/1997 | Chang ........................ 395/284 |
| 5,715,197 | A | * | 2/1998 | Nance et al. ............ 365/189.02 |
| 5,999,441 | A | * | 12/1999 | Runaldue et al. ............ 365/154 |
| 6,049,223 | A | * | 4/2000 | Lytle et al. ................... 326/40 |
| 6,075,721 | A | * | 6/2000 | Runaldue et al. ............ 365/154 |
| 6,097,651 | A | * | 8/2000 | Chan et al. .................. 365/203 |
| 6,426,649 | B1 | * | 7/2002 | Fu et al. ....................... 326/41 |

OTHER PUBLICATIONS http://www.actel.com, "Actel 40MX and 42MX Families FPGA's", pp. 1–115, Jan. 1999.

\* cited by examiner

Primary Examiner—Tuan V. Thai
(74) Attorney, Agent, or Firm—Silicon Valley Patent Group LLP; Michael J. Halbert

(57) ABSTRACT

A RAM device, such as the type embedded in a programmable logic device, is configurable to alter the depth of the addressable elements and the width of the number of data bits received or produced by the RAM device. The RAM device includes a number of address ports for receiving the read and/or write address signals, but the RAM device may be configured such that the depth requires fewer address signals then there are address ports. Likewise, the RAM device includes a number of input and output data ports for receiving and producing the data bits, but the width of the RAM device may be configured such that the number of data bits actually received or produced are less than the number of data ports. The depth and the width of the RAM device are configured together so that the depth is increased when the width is decreased and vice versa. This permits a number of appropriately configured RAM devices to be combined to produce a deep and wide RAM circuit without requiring the use of additional logic blocks, such as buffers, inverters, and multiplexors that reduce the speed of the circuit.

8 Claims, 16 Drawing Sheets

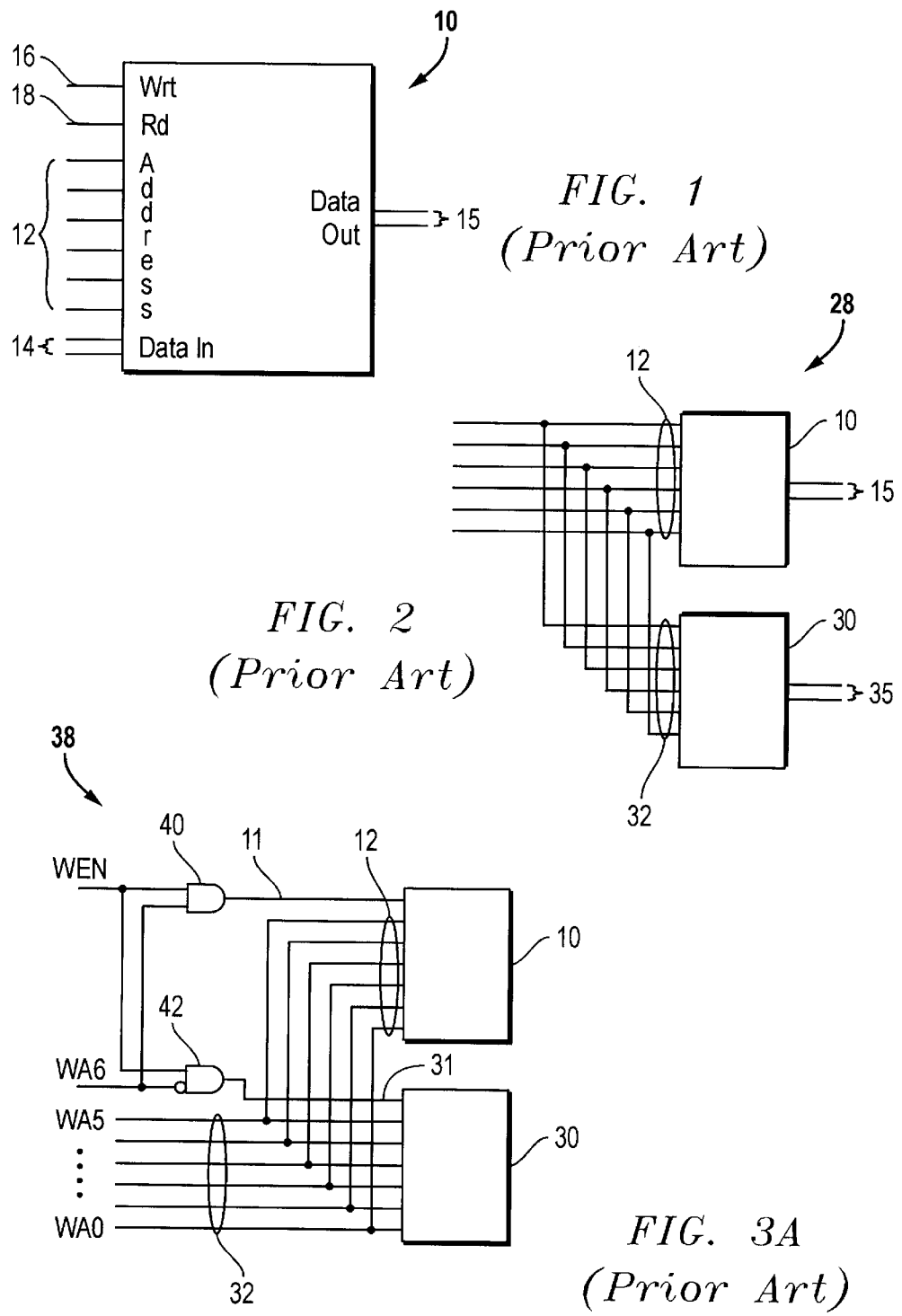

RAM WITH CONFIGURABLE DEPTH AND WIDTH

FIELD OF THE INVENTION

The present invention relates to semiconductor memory devices, and in particular to random access memory (RAM) devices having a configurable depth and width.

BACKGROUND

Conventional RAM devices include memory cells that are arranged in columns and rows. When writing a data bit into a particular memory cell, the data bit is provided on a bit line for an entire column of memory cells. A particular memory cell along the column is then selected for storing the information bit by providing a row selection signal on a particular write word line. The number of selectable memory cells or elements in the RAM device is known as the depth of the device. The depth of the RAM device is a function of the number of address bits received by the RAM device. The width of the RAM device is the number of data bits that can be stored in the RAM device per address location. Conventionally, the depth and width of a RAM device is fixed.

FIG. 1 shows a simplified view of a conventional RAM device 10. RAM device 10 is shown as having a six bit address port 12 and a two bit wide data word input port 14 and output port 15. RAM device 10 is also shown as having write and read select ports 16 and 18, respectively.

Because conventional RAM device 10 has a six bit address port 12, RAM device 10 has a depth of 64 elements ($2^6$=64). Because RAM device 10 has a two bit data word input and output ports 14 and 15, RAM device 10 has a width of 2. Thus, RAM device 10 has a size of 64×2, which is fixed.

Blocks of RAM devices are sometimes used in programmable logic devices as building blocks to generate larger RAM devices. When a user desires a RAM device having a greater depth and/or width, the user programs the programmable logic device to combine multiple RAM devices. The combination of multiple RAM devices, where each individual device has a fixed depth and width, results in a greater depth and/or width.

A user conventionally increases the width of a RAM device by combining multiple RAM devices as shown in FIG. 2. FIG. 2 shows a simplified view of two 64×2 RAM devices 10 and 30 combined to form a circuit 28 with an increased width of 64×4. Only the address ports 12, 32 and the data output ports 15, 35 are shown on RAM devices 10, 30, respectively, for the sake of simplicity. As shown in FIG. 2, the address ports of the two RAM devices 10 and 30 are combined in pairs. The total number of address bits received by the address ports 15 and 35 of the RAM devices 10 and 30 remains the same and, thus, the total depth remains 64. As shown in FIG. 2, the combination of RAM devices 10 and 30 results in four data output ports 15 and 35. Thus, by combining RAM devices 10 and 30 as shown in FIG. 2, the total width of the data bits that may be stored is increased by 2.

If a user desires a RAM device with an increased number of addressable elements, the user conventionally combines multiple RAM devices as shown in FIGS. 3A and 3B. FIGS. 3A and 3B show a simplified view of two 64×2 RAM devices 10 and 30 combined to form circuits 38 and 39 with an increased depth of 128×2 for write operations and read operations, respectively. The respective address ports 12 and 32 of RAM devices 10 and 30 are combined as in FIG. 2. As shown in FIG. 3A, for write operations, circuit 38 increases the depth from 64, i.e., 6 address ports, to 128, i.e., 7 address ports, with logic gates such as AND gate 40 and AND gate 42 coupled to enable control ports 11 and 31, respectively. As shown in FIG. 3A, AND gate 42 has a inverter at the write address 6 input terminal, i.e., the seventh address port. The input terminals of logic gates 40 and 42 are coupled together. As shown in FIG. 3B, for read operations, circuit 39 has the data output ports 15, 35 coupled to input terminals of a multiplexor (MUX) 44, shown as having two multiplexors, which selects the desired output ports. The read address 6 input terminal, i.e., the seventh address port, is coupled to the select terminal of MUX 44, which selects the appropriate data output ports based on the select signal. Thus, circuits 38 and 39 have effective RAM device sizes of 128×2. The depth of circuits 38 and 39 may be further increased by combining additional RAM devices in a similar manner. Unfortunately, each increase in depth requires the use of additional logic gates. The use of logic gates, however, slows the speed of the RAM device and requires additional power.

To avoid the use of many logic gates, large RAM devices may be manufactured. However, large RAM devices are expensive and utilizes a large amount of space on the chip. If the user desires only a small amount of RAM, the cost and space of the large RAM will be wasted.

SUMMARY

A RAM device, such as the type embedded in a programmable logic device, is configurable to alter the depth of the addressable elements and the width of the number of data bits stored in the RAM device per address. The RAM device includes a number of address ports for receiving the read and/or write address signals. However, for a shallow configuration of the RAM device, the RAM device receives fewer address signals then there are address ports. Consequently, in shallow configurations, a number of address ports will not be used. Likewise, the RAM device includes a number of input and output data ports, but the width of the RAM device may be configured such that the number of data bits actually stored in the RAM device is less than the number of data ports. Thus, in narrow configurations, a number of the input and output data ports will not be utilized.

The depth and the width of the RAM device are configured together so that the depth is increased when the width is decreased and vice versa. This permits the user to configure a number of RAM devices to the desired depth. The RAM devices may then be combined easily to increase the width. Consequently, the user can configure the RAM devices to be deep, wide, or both without the use of logic gates that would reduce the speed of the device. Further, because the RAM device is configurable, the user can use the amount of RAM desired and does not unnecessarily waste the RAM.

BRIEF DESCRIPTION OF THE DRAWINGS

FIG. 1 shows a simplified view of a conventional RAM device.

FIG. 2 shows a simplified view of two RAM devices combined to form a RAM device with an increased width.

FIGS. 3A and 3B show a simplified views of two RAM devices combined to form a RAM device with an increased depth for write operations and read operations, respectively.

FIG. 11, including

DETAILED DESCRIPTION

Figure 4:
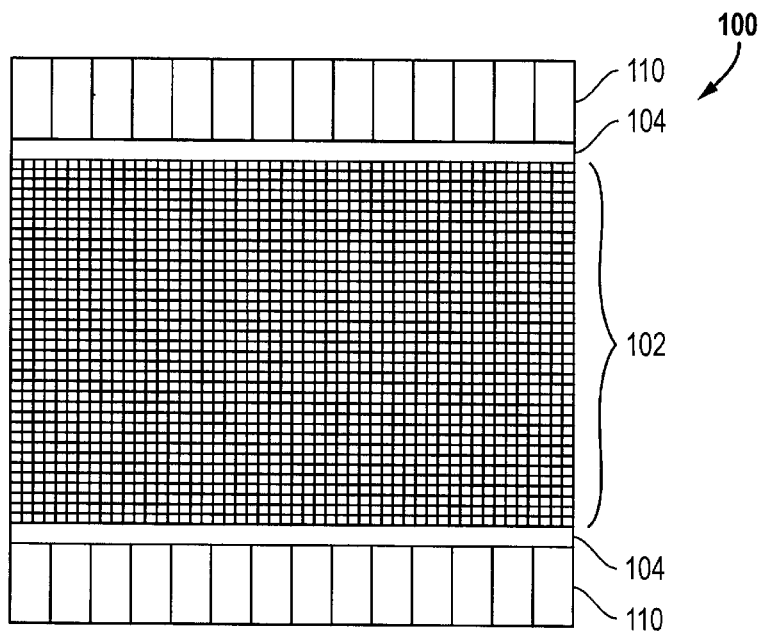
FIG. 4 shows a schematic view of a programmable logic circuit that includes a plurality of programmable logic cells and a plurality of configurable RAM devices in accordance with an embodiment of the present invention.

FIG. 4 shows a schematic view of a programmable logic circuit 100 that includes a plurality of programmable logic cells 102 and that is embedded with a plurality of RAM devices 110. Each logic cell is a collection of logic gates with associated interconnections and programming devices, such as antifuses. An interface 104 is disposed between the programmable logic cells 102 and the plurality of RAM devices 110. The programmable logic cells 102 and interface 104 may be conventional, while RAM devices 110 have a configurable depth and width in accordance with the present invention.

Figure 5:
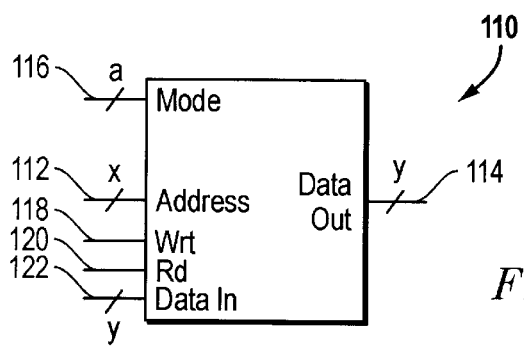
FIG. 5 shows a simplified view of a configurable RAM device.
Figure 6A:
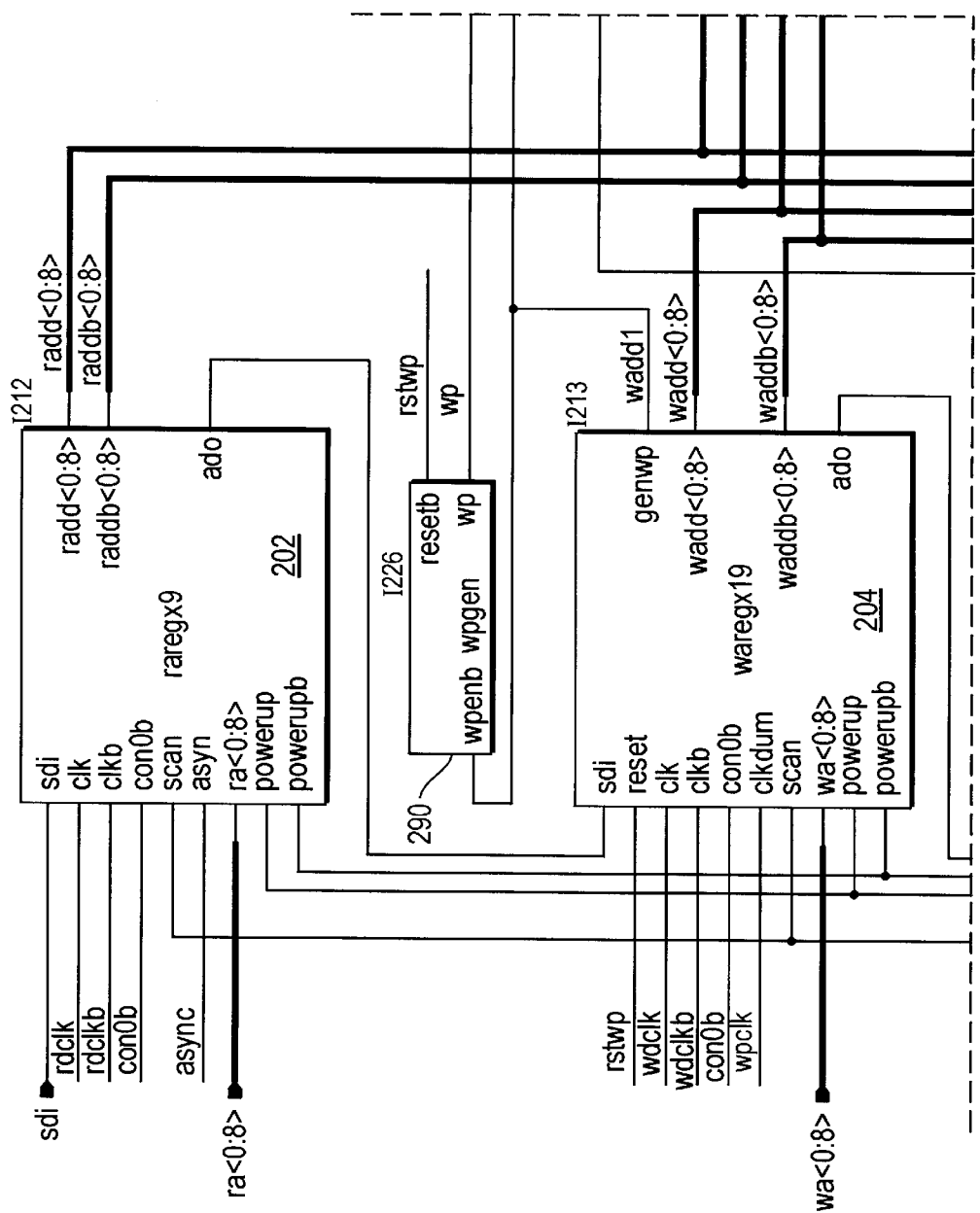
FIG. 6, including FIGS. 6A, 6B, 6C, and shows a schematic view of a configurable RAM device that has a configurable depth and width in accordance with the present invention.
Figure 6B:
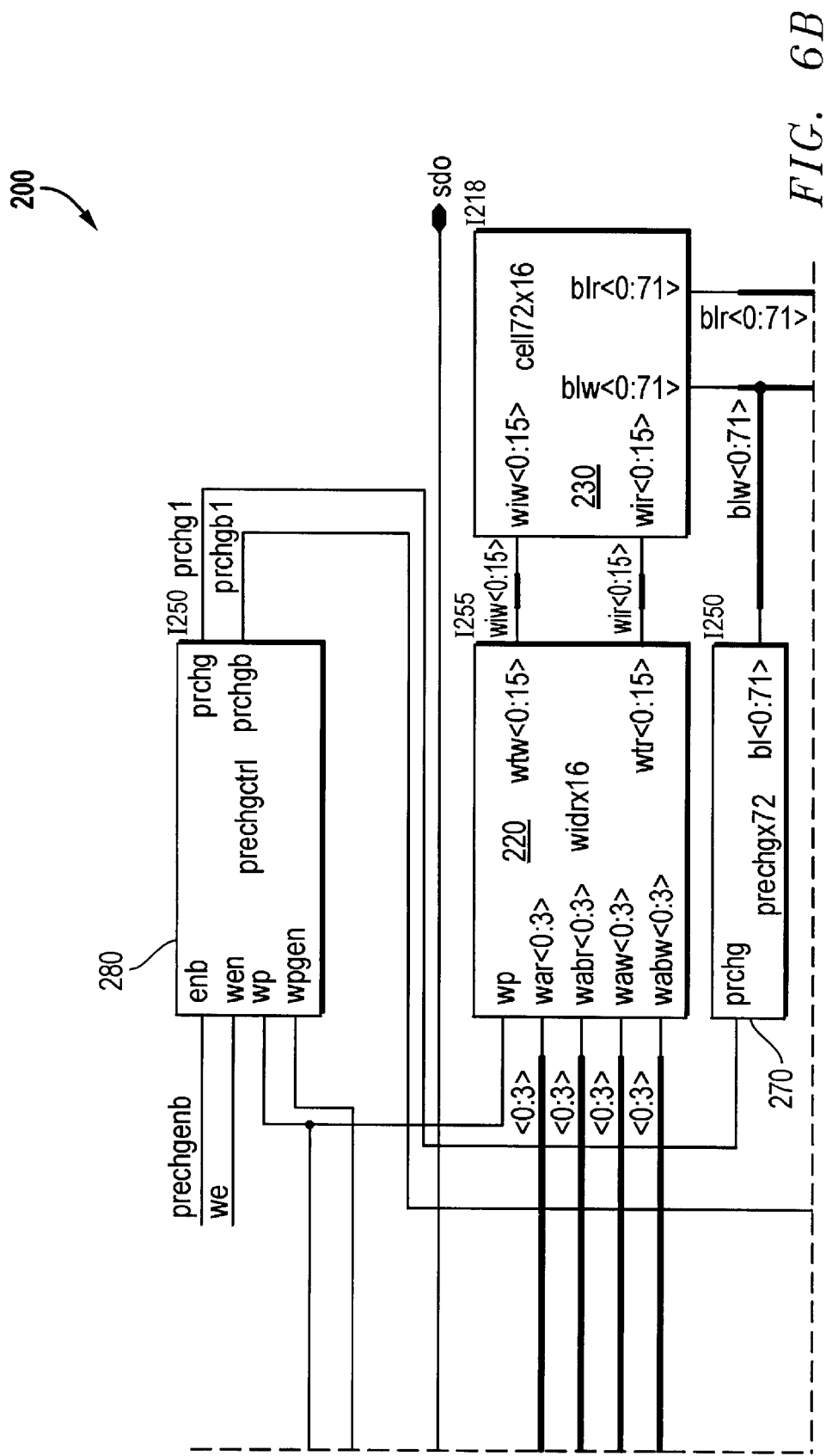
Figure 6C:
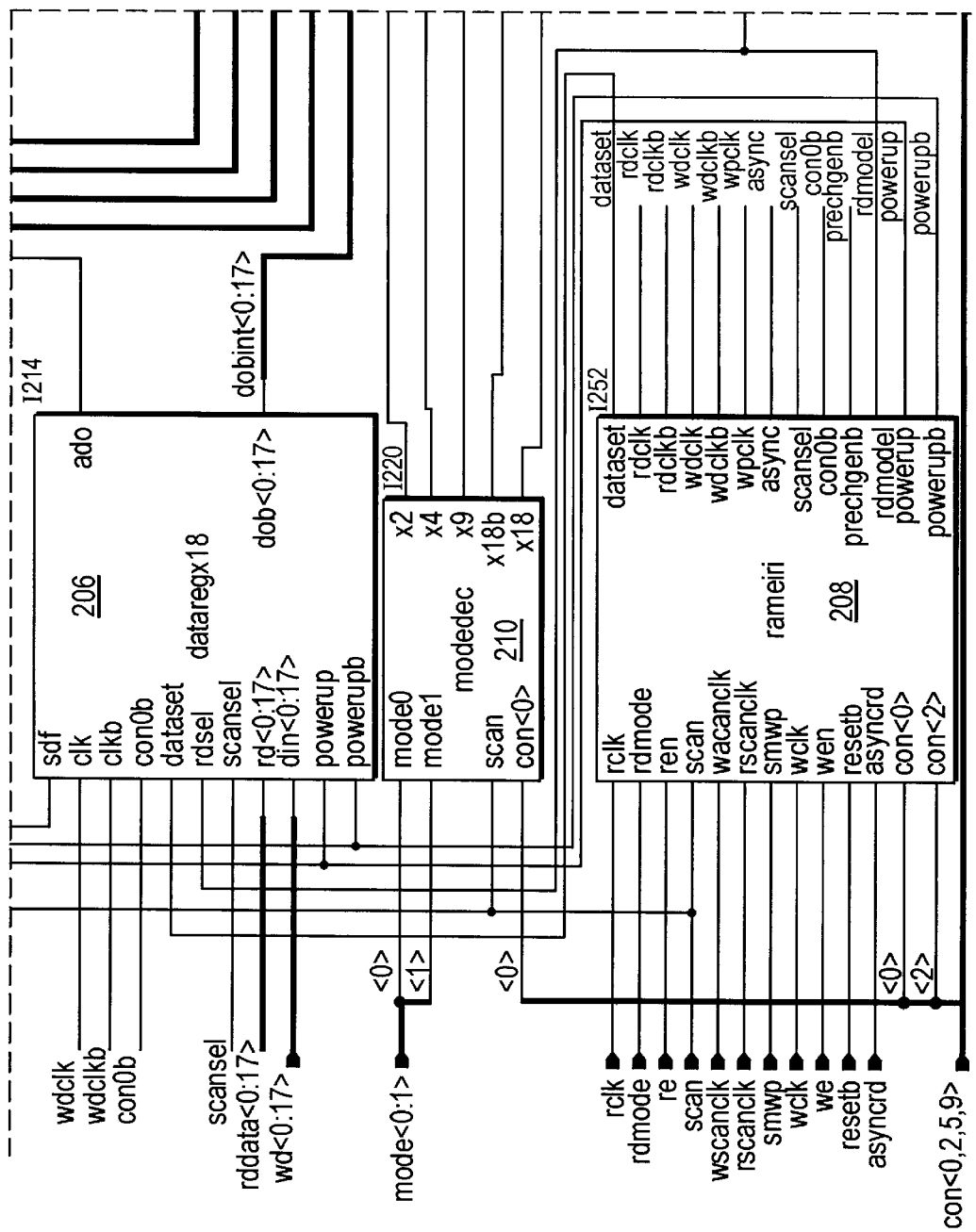
Figure 6D:
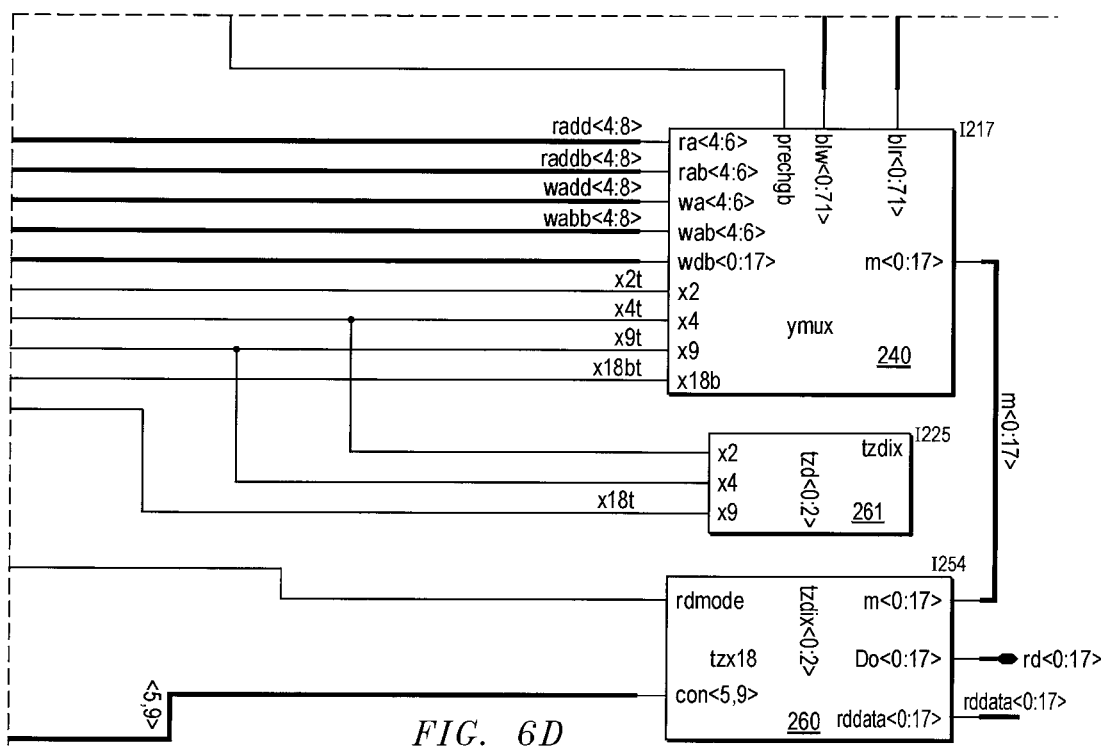

FIG. 5 shows a simplified view of a configurable RAM device 110. RAM device 110 includes a configurable number of address ports 112 and a configurable number of data input ports 122 and output ports 114. The number of address ports 112 is represented by an "x", while the number of input ports 122 and output ports 114 are represented by a "y". RAM device 110 also includes a mode port 116, which may have multiple ports, e.g., 2 ports, represented by a "a". Mode port 116 receives mode signals indicating the desired depth and width of RAM device 110, i.e., the signals at the mode port 116 is used to determine the number (x) of address ports 112 and the number (y) of data input ports 122 and output ports 114. As shown in FIG. 5, RAM device 110 also includes other ports, such as the write control port 118 and read control port 120, both of which include enable and clock ports for respective write and read operations. RAM device 110 also includes the data input port 122. RAM device 110, of course, includes other conventional ports.

RAM device 110 has a maximum number of address ports 112 that may be used, e.g., $x \leq 9$, and a maximum number of data input ports 122 and output ports 114 that may be used, e.g., $y \leq 18$. Thus, RAM device 110 has a maximum depth of addressable elements of 512 ($2^9=512$) and a maximum width of data bits stored is 18. However, a RAM device having a depth and width of 512×18 would be a relatively large block of RAM, which would be expensive to manufacture in terms of space on the silicon chip and would be slow. Moreover, a 512×18 RAM device would often be under utilized. Consequently, in accordance with an embodiment of the present invention, RAM device 110 is configurable into a number of smaller sizes, or modes. Depending on the desired mode of RAM device 110, certain of the nine address ports 112 and of the eighteen data output ports 114 and input ports 122 will be unused.

By way of example, RAM device 110 will be described as configurable into four different modes of operation having a depth and a width of 64×18 ("×18"), 128×9 ("×9"), 256×4 ("×4"), and 512×2 ("×2"). The ×18 mode has a depth of 64 and thus uses six of the address ports 112 ($2^6=64$). The other modes use seven, eight, and nine of the address ports 112, respectively. The ×18 mode has a width of 18 and thus uses all of the input ports 122 and output ports 114. The other modes use nine, four, and two of the input ports 122 and output ports 114, respectively. Thus, as can be seen, RAM device 110 advantageously trades off the depth and width of the RAM device 110 so that RAM device 110 can support either a deep but narrow configuration or a shallow but wide configuration, as well as in between configurations.

Figure 3B:
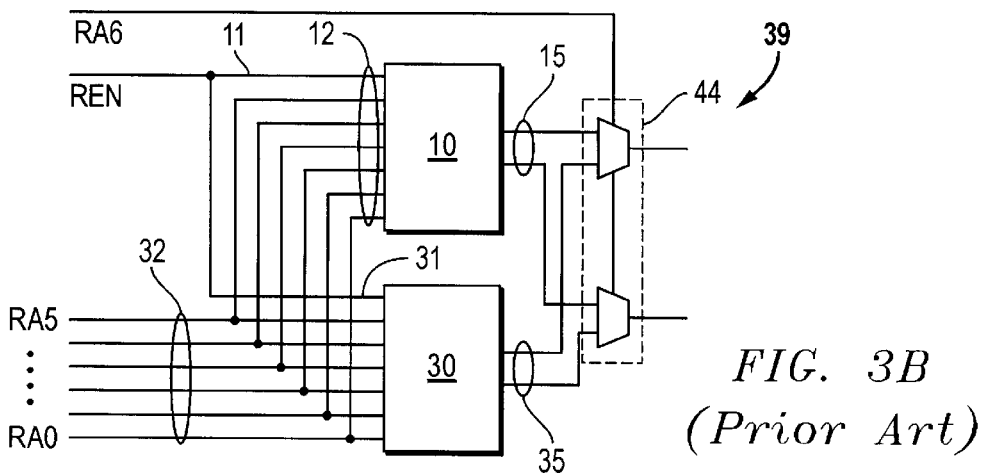

Because RAM device 110 has a configurable depth and width, multiple RAM devices may be coupled together in programmable logic circuit 100 to create many different sizes of RAM, which is particularly useful in creating FIFO's (first-in-first-out) circuits. The design requirements for FIFOs are usually very specific, i.e., either deep RAM devices or shallow RAM devices are required. Advantageously, the present invention permits the user to easily configure the depth and width of RAM to the desired size, without losing speed of the device or wasting areas of the RAM. If, for example, a user desires a deep RAM with 32 bits of data, RAM device 110 can be configured into a deep but shallow mode, e.g., 512×2. The user can couple sixteen RAM devices 110 together, in a manner similar to that shown in FIG. 2, resulting in a combined 512×32 RAM circuit. Consequently, the user is not required to use logic gates in the front and back of the RAM devices, as shown in FIG. 3, to produce a deep RAM.

As shown in FIG. 4, there are four columns of logic cells 102 for every RAM device 110. Each individual column of logic cells contains a finite number of channels, e.g., 38. RAM devices 110, however, requires a large number of input signals, e.g., 64. By using four columns of logic cells 102 per RAM device 110, there is a much greater number of channels per RAM device 110, e.g., 152, than if only one column is used. Thus, it is assured that RAM device 110 will have access to an adequate number of channels, while each logic cell will have an adequate number of remaining channels for routing.

FIGS. 6 through 15 show detailed schematics, in various detail, and associated tables, of a RAM device 200, which has a configurable depth and width in accordance with the present invention. RAM device 200 may be used in programmable logic circuit 100 (FIG. 4). Conventional areas of RAM device 200 are shown in FIGS. 6 through 15 in block form in order to avoid unnecessarily obfuscating the present invention.

As shown in FIG. 6, RAM device 200 is a dual port RAM having a conventional read address register 202 and a separate conventional write address register 204. Because RAM device 200 is a dual port RAM, many of the elements in RAM device 200 are duplicated, one set of elements for writing and another set for reading. It should be understood, however, that a single port RAM embodying the present invention may be easily designed by one of ordinary skill in light of the present disclosure, for example, by combining any duplicate elements into a single element.

Read address register 202 includes nine ports to receive the read address (ra<0:8>) and the write address register includes nine ports to receive the write address (wa<0:8>). Because there are physically nine ports to receive the read address (ra<0:8>) and the write address (wa<0:8>), the RAM device 200 can support a deep configuration, i.e., the 512×2 configuration. In shallower configurations, e.g., the 256×4, 128×9, and 64×18, some of the ports will not be used. As shown in FIG. 6, read address register 202 and write address register 204 receive independent control signals including their own clocking signals (rdclk and wdclk, respectively) from a RAM control 208. This advantageously permits RAM device 200 to read and write data simultaneously and at different clock frequencies. Of course, these functions may be combined into one address register such that RAM device 200 acts as a single port RAM, as is well understood by those of ordinary skill in the art.

RAM device 200 also includes a conventional data register 206, which receives write data (wd<0:17>), which is the input data to the RAM device 200. There are physically eighteen ports into data register 206 for receiving write data (wd<0:17>) so that a wide configuration, i.e., ×18, is supported by RAM device 200. However, in narrow configurations, e.g., ×2, ×4, and ×9, some of the ports will not be used.

Also included in RAM device 200 is the RAM control 208. RAM control 208 controls the operation of RAM device 200. As can be seen in FIG. 6, RAM control 208 receives a number of input signals, including a read clock signal (rclk) and a separate write clock signal (wclk), and other necessary input signals, which RAM control 208 uses to independently control read address register 202 and write address register 204. RAM control 208 is a conventional RAM control circuit except that it independently controls read operation on one port and a write operation on the other port.

Figures 7, 8:
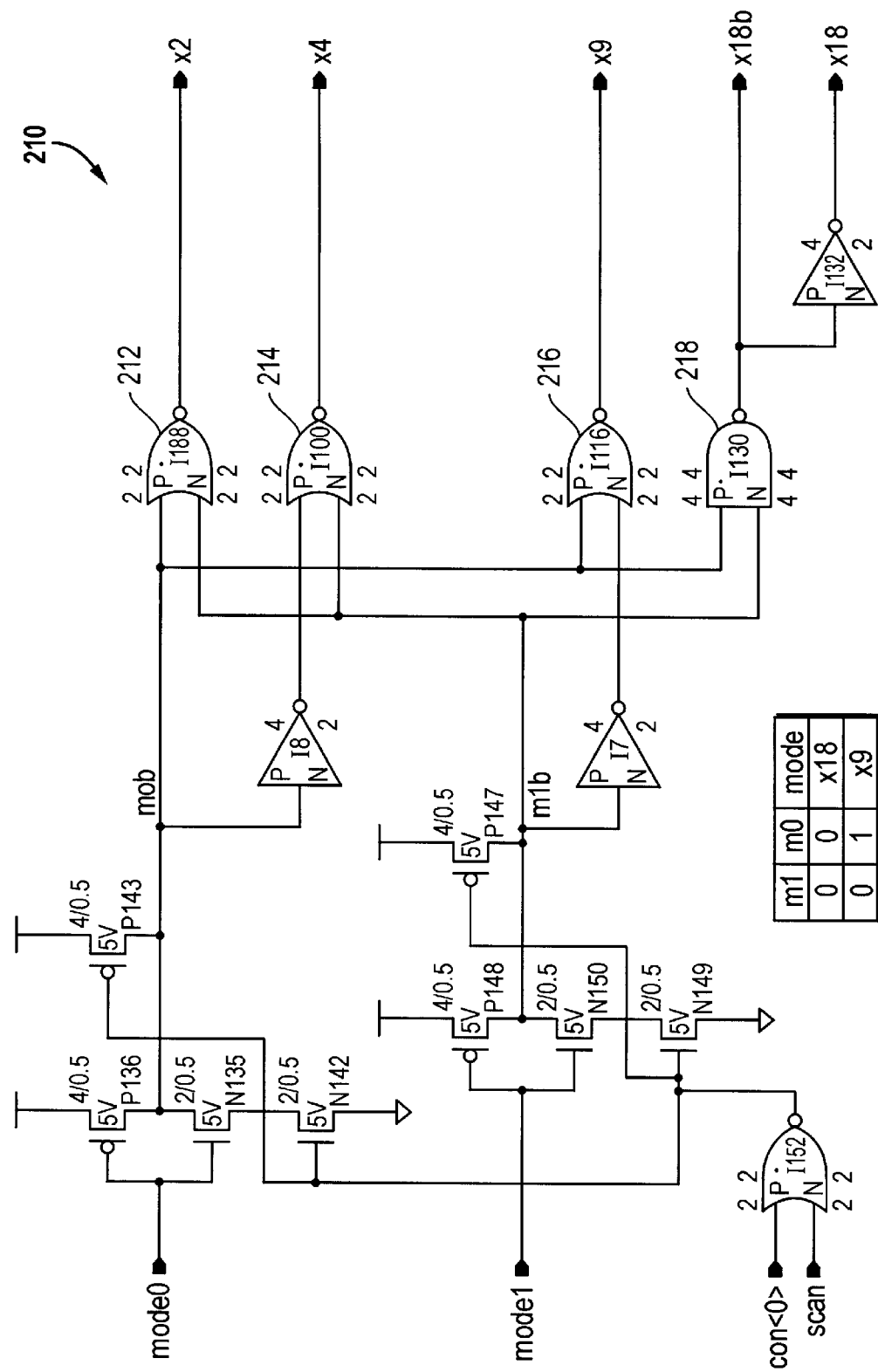
FIG. 7 shows a detailed schematic view of the mode decoder shown in FIG. 6.
FIG. 8 is a truth table showing the mode designated by the mode decoder based on the input signals on the two mode input ports.

RAM device 200 also includes a mode decoder 210, which decodes the mode control signals (mode<0:1>) used to define the size configuration of RAM device 200. Mode decoder 210 is shown in greater detail in FIG. 7. As shown in FIG. 7, mode decoder 210 receives two mode input ports (mode0 and mode1), which are logically converted by NOR logic gates 212, 214, and 216 and NAND logic gate 218 into configuration signals used to configure the depth and width of RAM device 200, i.e., ×2, ×4, ×9, or ×18. In addition, mode decoder 210 receives a control signal (con<0>) and a scan signal (scan). Control signal (con<0>) is an internal disable signal that is used to facilitate testing of the RAM device 200 during production. Scan signal (scan) is used in power up loading of the RAM. Both control signal (con<0>) and scan signal scan are logic "0" during normal operation of the RAM device 200 and are not relevant to the operation of the present invention. FIG. 8 is a truth table showing the mode designated by mode decoder 210 based on the input signals on the two mode input ports (mode0 and mode1), which are fixed during programming.

The read address register 202 and write address register 204 produce read address signals (radd<0:8>) and write address signals (wadd<0:8>), respectively. The first four least significant bits of read address (radd<0:3>) and write address (wadd<0:3>) are siphoned off and received by a conventional ×16 word line decoder 220, which provides write word line signals (wlw<0:15>) and read word line signals (wlr<0:15>) to an array of memory cells 230.

The remaining bits of the read address signal (radd<4:8>) and write address signal (wadd<4:8>) are received by multiplexor 240. Multiplexor 240 also receives the output signals from mode decoder 210 designating the size configuration of RAM device 200 and the write data (wd<0:17>) from the data register 206 to be written into the array of memory cells 230, during write operations. Multiplexor 240 produces the bit line write (blw<0:71>) to the memory cells 230, and receives the bit line read (blr<0:71>) from memory cells 230. Multiplexor 240 also produces the read data (m<0:17>) from the array of memory cells 230 during read operations.

Figures 9, 9A:
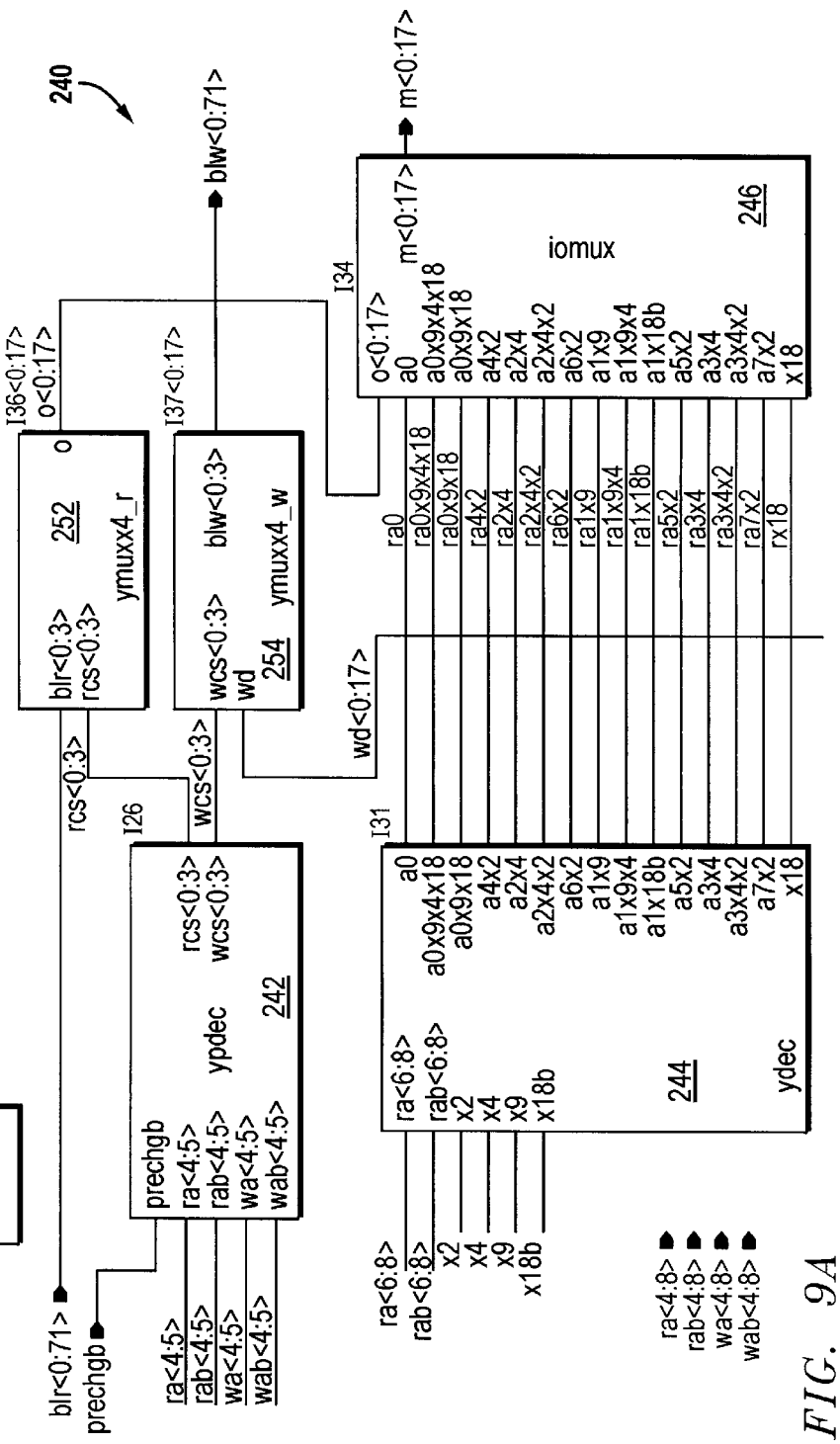
FIG. 9, including
FIGS. 9A and 9B, shows a detailed schematic view of a multiplexor shown in FIG. 6.
Figure 9B:
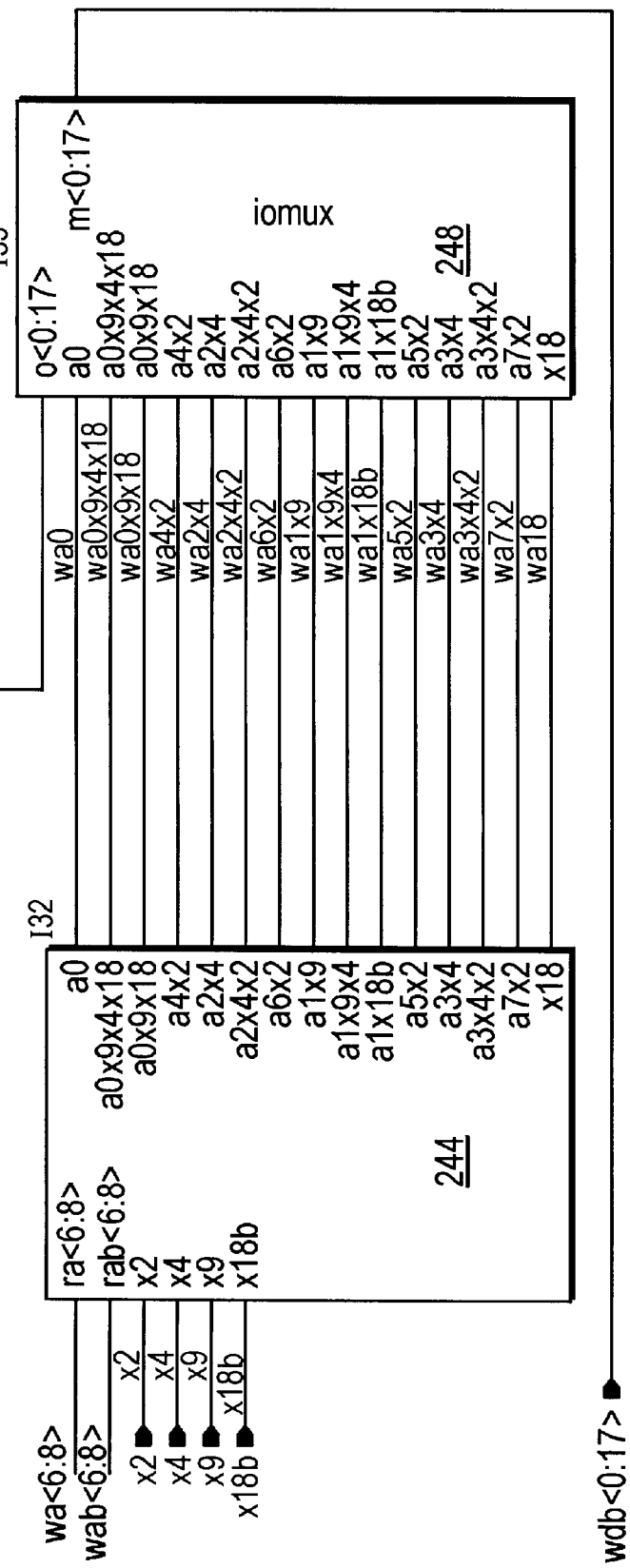
Figure 10:
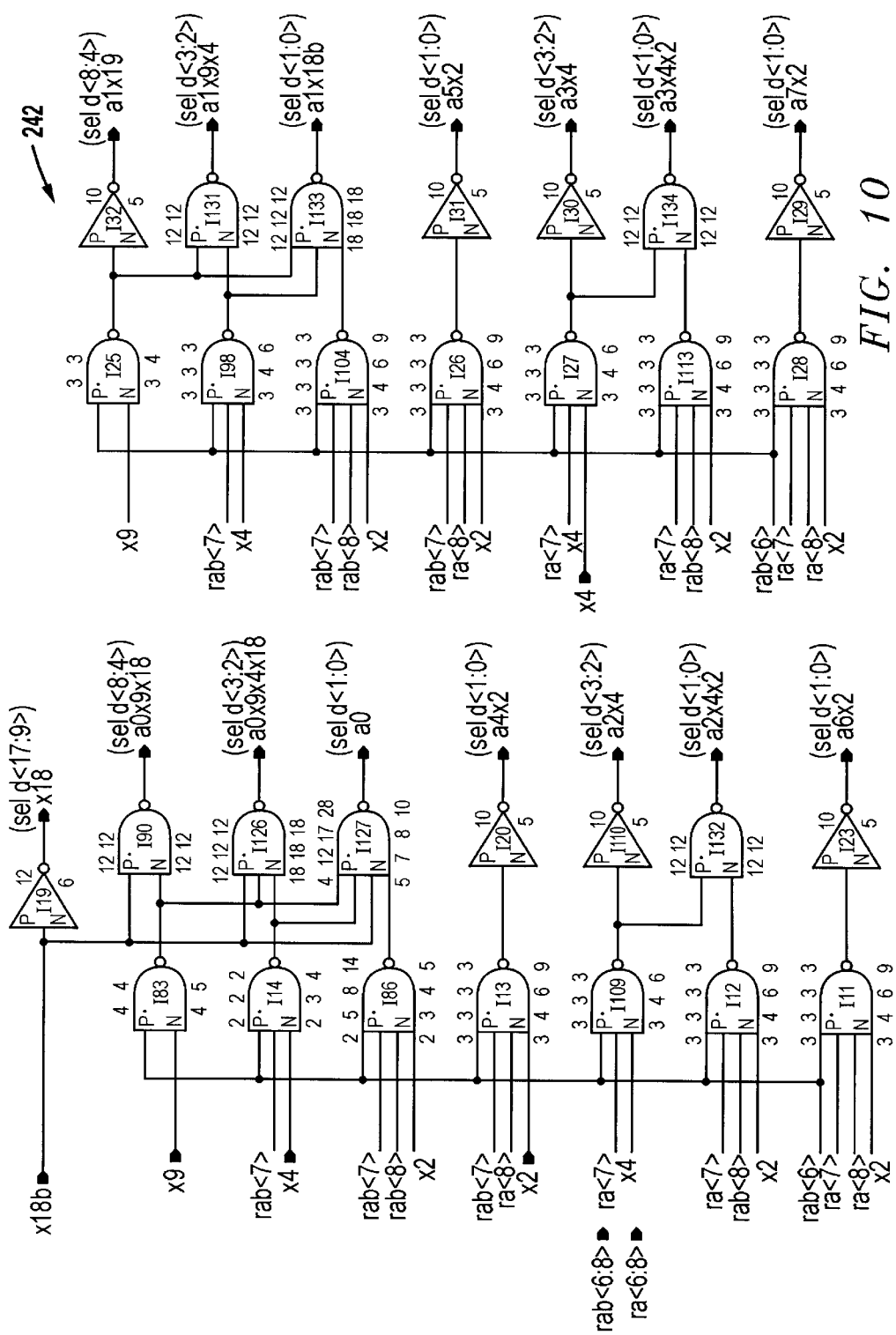
FIG. 10 shows a detailed schematic view of a decoder shown in FIG. 9.

FIG. 9 shows a detailed schematic of multiplexor 240. As shown in FIG. 9, multiplexor 240 includes two decoders 242, 244 which receive some of the bits from the read address (ra<6:8>) and the write address (wa<6:8>), respectively, as well as the size configuration. FIG. 10 shows a detailed schematic of decoder 242. It should be understood that decoder 244 is substantially the same as decoder 242. Decoder 242 logically converts the mode and the address signals it receives into output signals.

Multiplexor 240 also includes a conventional predecode unit 250 and conventional read and write multiplexors 252, 254, which respectively receive the bit line read signals (blr<0:71>) from the array of memory cells 230 and transmit the bit line write signals (blw<0:17>) to the array of memory cells 230.

Figure 11:
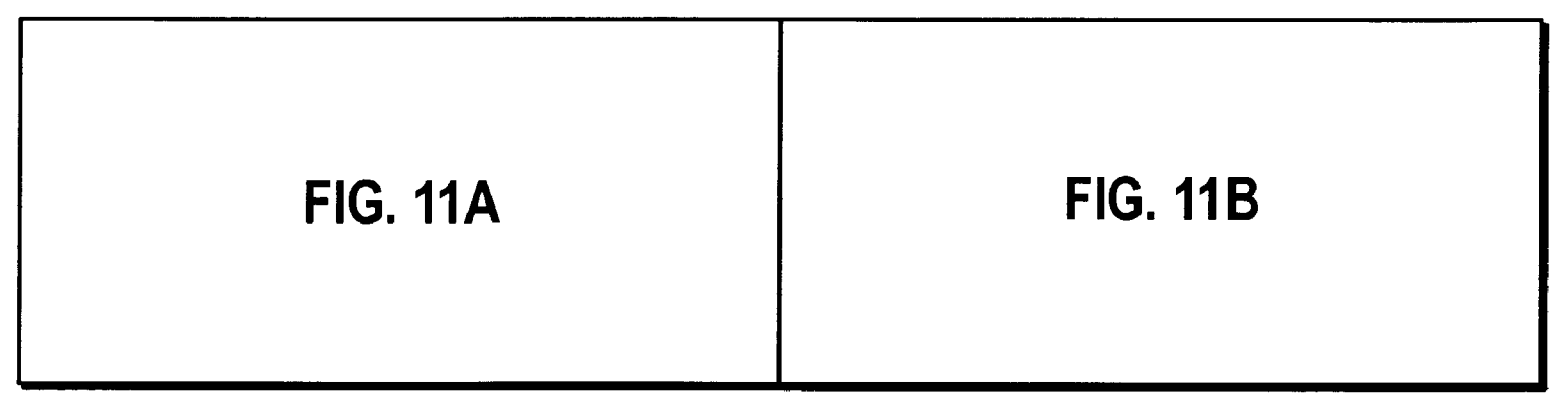
Figures 11A, 12:
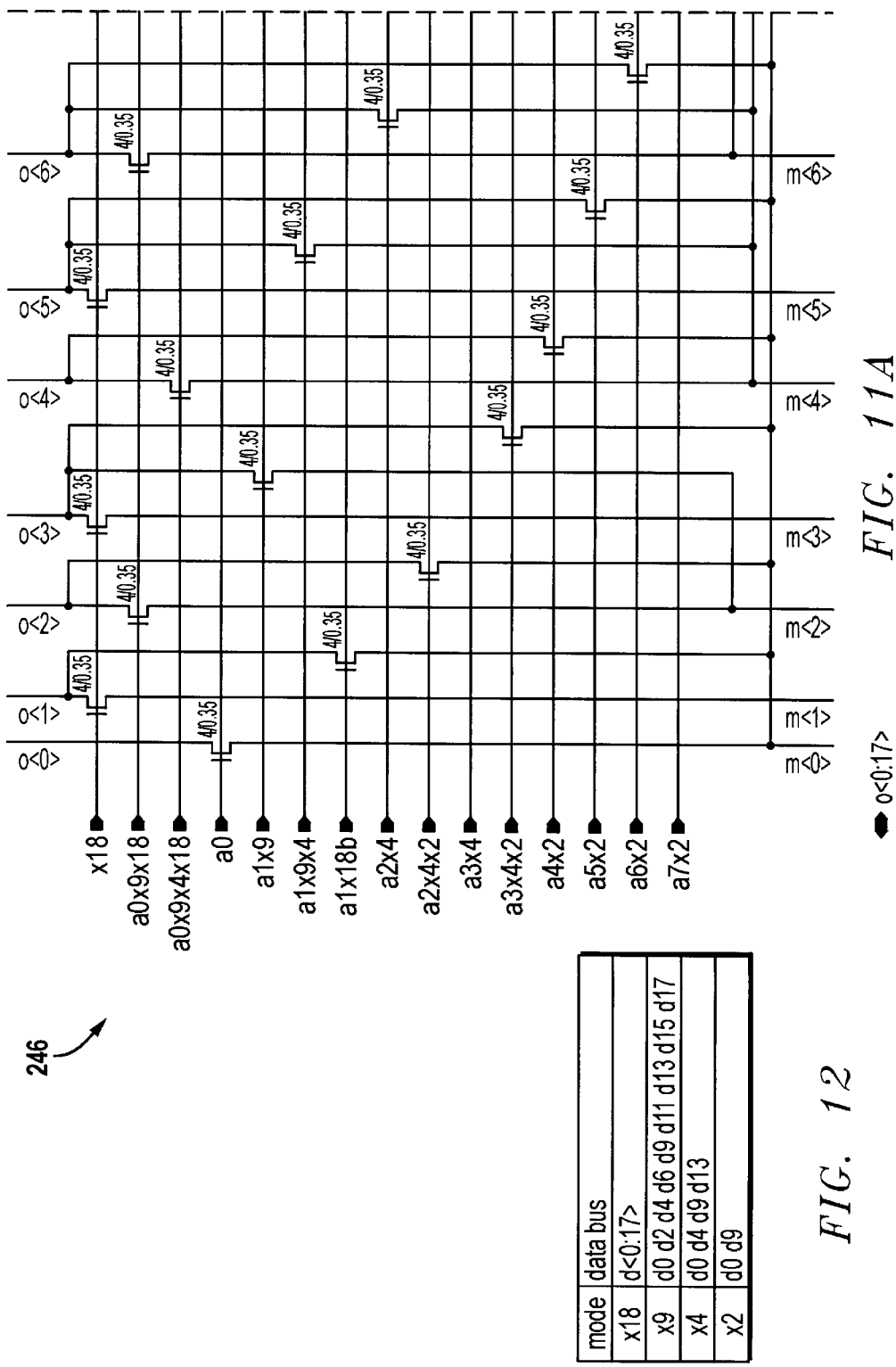
FIGS. 11A and 11B, shows a detailed schematic view of the input/output multiplexor shown in FIG. 9.
FIG. 12 is a table indicating the data busses used in the input/output multiplexor in the different modes.
Figure 11B:
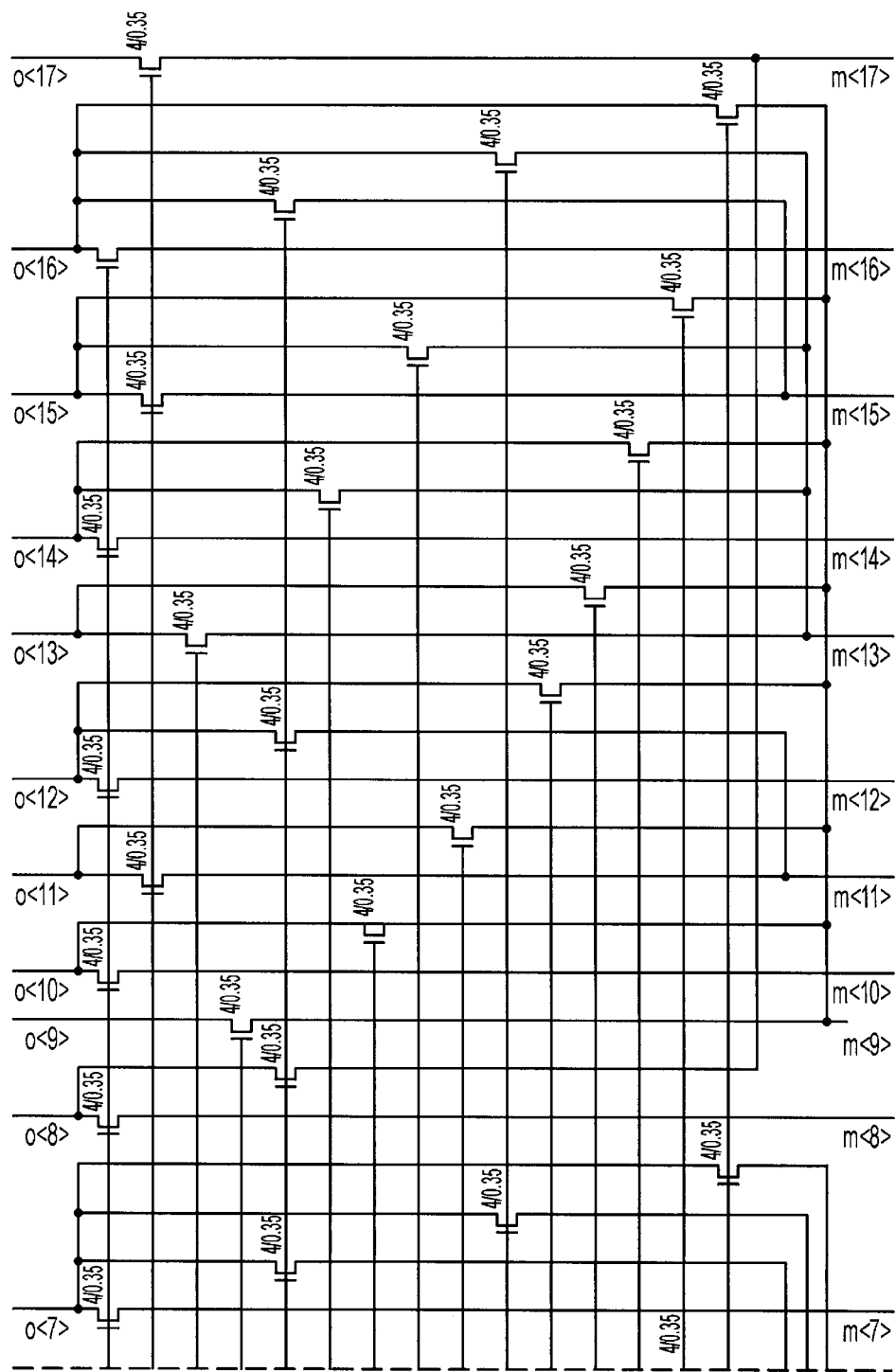

As shown in FIG. 9, multiplexor 240 includes two input/output multiplexors ("iomux") 246, 248, which receive the output signals from respective decoders 242, 244. As can be seen, iomux 248 receives the write data (wdb<0:17>) to be written into RAM device 200 from data register 206, while iomux 246 produces the read data (m<0:17>) to be produced by RAM device 200. FIG. 11 shows a detailed schematic of iomux 246. It should be understood, however, that iomux 248 is substantially similar to iomux 246. Based on the output signals generated by decoder 242, iomux 246 will select the appropriate data busses. FIG. 12 shows a table indicating the data busses that are used in the different modes. As shown in FIG. 12, in the ×18 mode all eighteen data busses are used, in the ×9 mode data busses d0, d2, d4, d6, d9, d11, d13, d15, and d17 are used, in the ×4 mode data busses d0, d4, d9, d13 are used, and in the ×2 mode only data busses d0 and d9 are used. Thus, iomux 246 can support a ×18 wide data register but, depending on the mode, can convert to a narrower data register, such as a ×2, ×4 or ×9.

Figure 13:
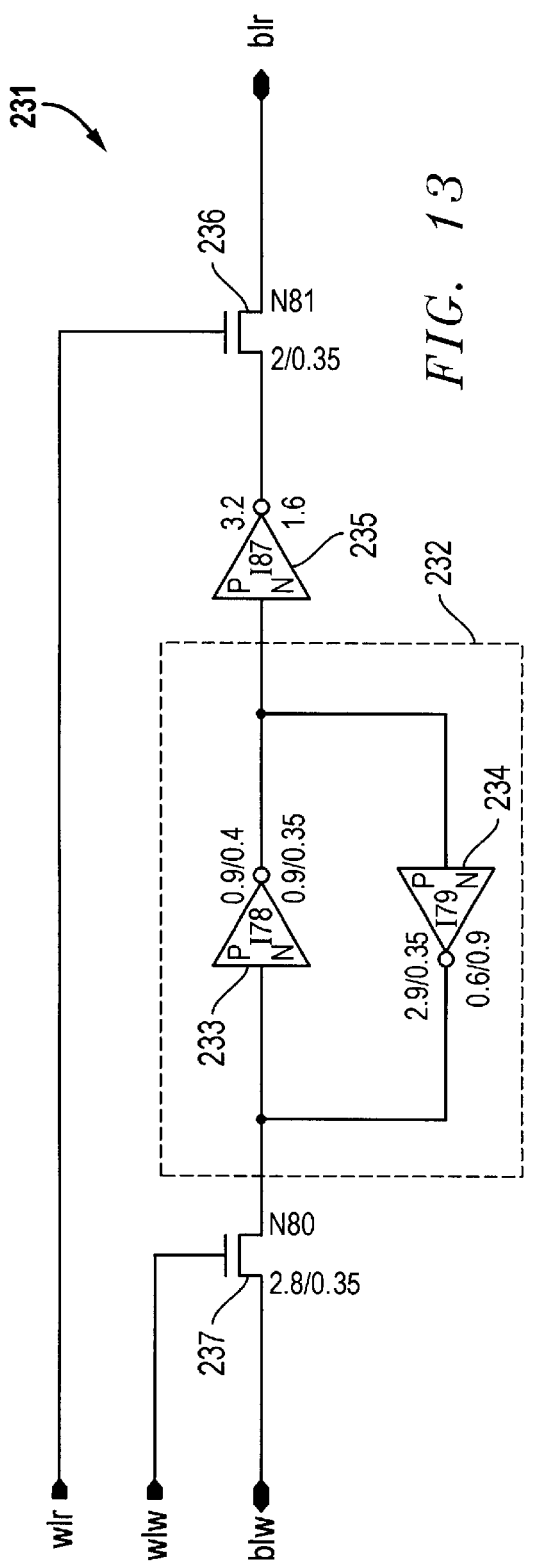
FIG. 13 shows a detailed schematic view of a memory cell.

FIG. 13 shows a schematic view of an individual memory cell 231 that is used in the array of memory cells 230. Memory cell 231 is disposed between a read bit line blr and a write bit line blw. The memory cell 231 includes a latching circuit 232 having a first inverter 233 cross-connected with a second inverter 234 that are connected to the read bit line blr through transistor 236 and to the write bit line blw through transistor 237. The memory cell 231 also includes a buffer 235 that is used to isolate the latching circuit 232 from any capacitive loading on the read bit line blr. Buffer 235 is larger than either first inverter 233 or second inverter 234. The gates of transistors 236 and 237 are connected to read word lines wlr and write word lines wlw from word line decoder 220 (shown in FIG. 6).

The array of memory cells 230 shown in FIG. 6 is an array of 72 columns and 16 rows of memory cells 231 as shown in FIG. 13.

Figure 14:
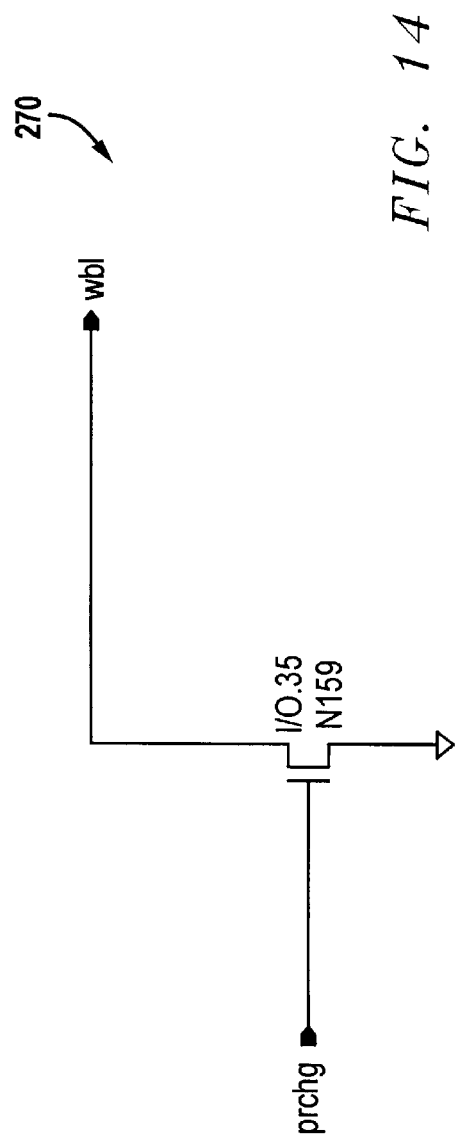
FIG. 14 shows a detailed schematic view of a precharge circuit.

Each write bit line wbl in the array of memory cells 230 is coupled to a precharge circuit 270. FIG. 14 shows precharge circuit 270. As shown in FIG. 14, precharge circuit 270 switchably connects write bit line wbl to a ground reference voltage in response to a precharge signal prchg.

Figure 15:
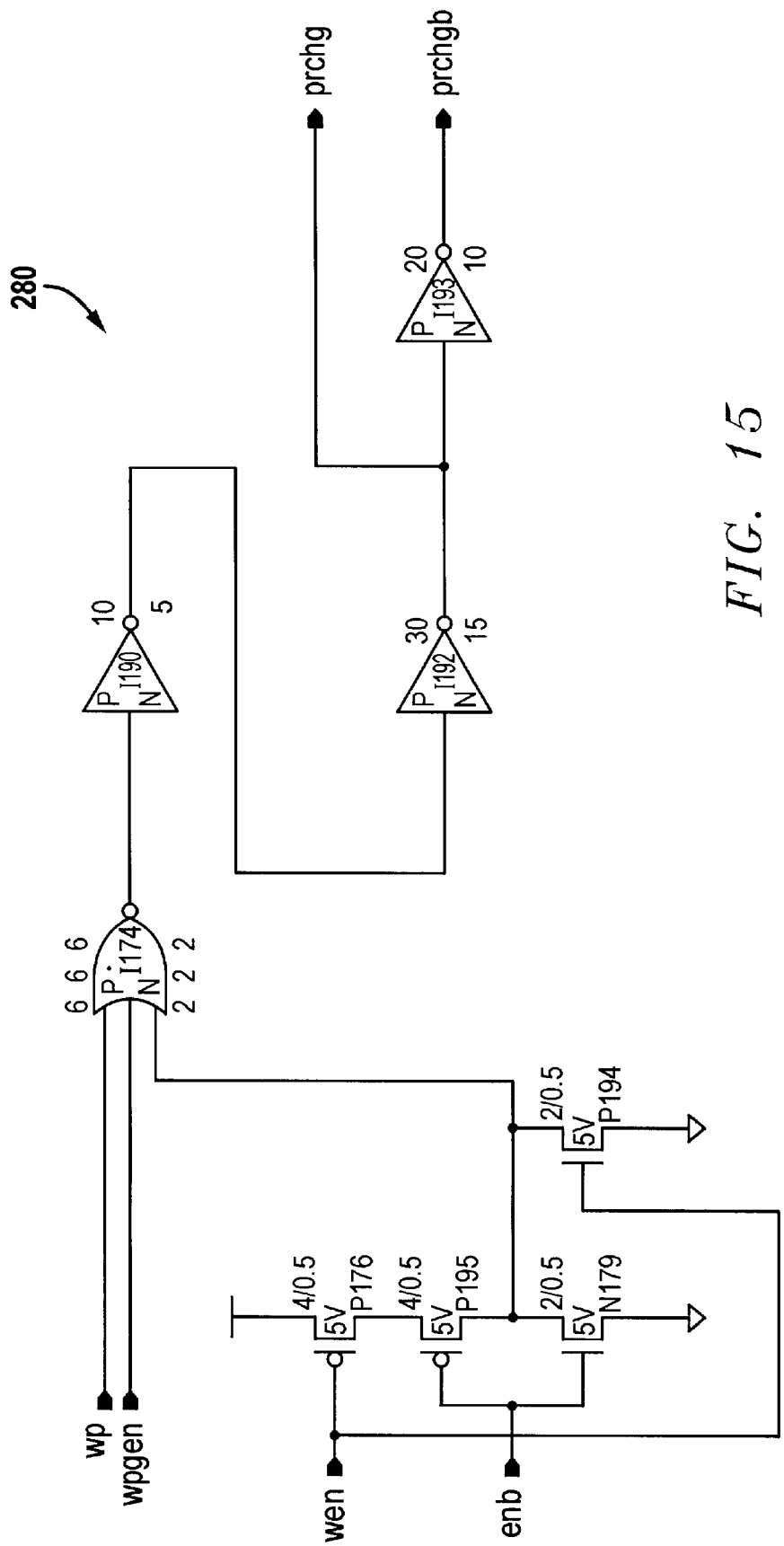
FIG. 15 shows a detailed schematic view of a precharge control circuit.

Precharge circuit 270 is controlled by a precharge control circuit 280, as shown in FIG. 15. As shown in FIG. 15, precharge control circuit 280 receives a write pulse signal from the write pulse generator 290 (FIG. 6), which produces a delayed write pulse signal wp after receiving the generate write pulse signal genwp from write address register 204. Precharge control circuit 280 also receives the write enable signal wen and a precharge enable signal enb from the RAM control 208. The write enable signal wen is conventionally generated when it is desired that RAM device 100 perform a write operation. The precharge enable signal enb is a test signal and is a logic "0" during normal operation of RAM device 100.

It should be understood that if desired, a conventional memory cell and precharge circuit may be used.

The read data (m<0:17>)produced by multiplexor 240 is received by a conventional driver buffer circuit 260, which produces the read data (rd<0:17>). Driver buffer circuit 260 is coupled to a conventional enable circuit 261 that receives the mode signals from mode decoder 210 and enables only output ports that are used. Thus, the unused output ports from driver buffer circuit are disabled.

While the present invention has been described in connection with specific embodiments, one of ordinary skill in the art will recognize that various substitutions, modifications and combinations of the embodiments may be made after having reviewed the present disclosure. The specific embodiments described above are illustrative only. Various adaptations and modifications may be made without departing from the scope of the invention. For example, the configurable depth and width may be used with single port or dual port RAM devices. The spirit and scope of the appended claims should not be limited to the foregoing description.

What is claimed is:

1. An apparatus comprising:
   a plurality of programmable logic circuits;
   a plurality of configurable RAM circuits programmably coupled to said plurality of programmable logic circuits wherein each configurable RAM circuit has a configurable depth of addressable elements and a configurable width of the number of data bits that may be stored in said configurable RAM circuit,
   wherein each configurable RAM circuit has at least one mode input port for receiving a mode signal indicating the configuration of said configurable depth and said configurable width, and wherein each configurable RAM circuit further comprises:
      a plurality of address ports;
      a plurality of data input ports;
      a plurality of data output ports;
      wherein said RAM circuit receives address signals on less than all said plurality of address ports when said configurable depth is configured to be less than a maximum, said RAM circuit receives data bits on less than all said plurality of data input ports and produces data bits on less than all said plurality of data output ports when said configurable width is less than a maximum, and
   wherein each configurable RAM circuit further comprises:
      an array of memory cells for storing data;
      a multiplexor circuit electrically coupled to said at least one mode input port, said plurality of address ports, said plurality of data input ports, and said plurality of data output ports, said multiplexor circuit coupled to said array of memory cells, said multiplexor circuit obtaining stored data from said array of memory cells in response to at least a portion of said mode signals and said address signals, and
      wherein each configurable RAM circuit further comprises a mode decoder electrically coupled between said at least one mode input port and said multiplexor.

2. The apparatus of claim 1, wherein said configurable depth and said configurable width are configured in relation to each other.

3. The apparatus of claim 2, wherein said configurable depth is increased when said configurable width is decreased and said configurable width is increased when said configurable depth is decreased.

4. The apparatus of claim 1, wherein said configurable RAM circuit has a plurality of configurations.

5. The apparatus of claim 4, wherein said configurable RAM circuit has four configurations.

6. The apparatus of claim 1, wherein said depth of programmable elements may be configured so that the number of address signals required is less than the number of said plurality of address ports, and said width of said number of data bits may be configured so that said number of data bits is less than the number of said plurality of data output ports and less than the number of said plurality of data input ports.

7. The apparatus of claim 1, wherein said plurality of address ports comprises a plurality of read address ports for receiving read address signals and a plurality of write address ports for receiving write address signals.

8. An apparatus comprising:

a plurality of programmable logic circuits; and a plurality of configurable RAM circuits programmably coupled to said plurality of programmable logic circuits, wherein each configurable RAM circuit has a configurable depth of addressable elements and a configurable width of the number of data bits that may be stored in said configurable RAM circuit, wherein each configurable RAM circuit has at least one mode input port for receiving a mode signal indicating the configuration of said configurable depth and said configurable width, wherein each configurable RAM circuit further comprises:

a plurality of address ports;

a plurality of data input ports;

a plurality of data output ports;

an array of memory cells for storing data;

a multiplexor circuit electrically coupled to said at least one mode input port, said plurality of address ports, said plurality of data input ports, and said plurality of data output ports, said multiplexor circuit coupled to said array of memory cells, said multiplexor circuit obtaining stored data from said array of memory cells in response to at least a portion of said mode signals, wherein each configurable RAM circuit further comprises a mode decoder electrically coupled between said at least one mode input port and said multiplexor.

* * * * *